(12) United States Patent
Dumais et al.

(10) Patent No.: US 9,946,023 B2
(45) Date of Patent: Apr. 17, 2018

(54) OPTICAL ATTENUATOR AND FABRICATION METHOD THEREOF

(71) Applicants: Patrick Dumais, Ottawa (CA); Dritan Celo, Nepean (CA)

(72) Inventors: Patrick Dumais, Ottawa (CA); Dritan Celo, Nepean (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/818,453

(22) Filed: Aug. 5, 2015

(65) Prior Publication Data
US 2017/0038532 A1  Feb. 9, 2017

(51) Int. Cl.
| | | |
|---|---|---|
| *G02B 6/24* | (2006.01) | |
| *G02B 6/122* | (2006.01) | |
| *G02B 6/125* | (2006.01) | |
| *G02B 6/134* | (2006.01) | |
| *G02B 6/136* | (2006.01) | |
| *G02B 6/13* | (2006.01) | |
| *G02B 6/132* | (2006.01) | |
| *H01L 31/028* | (2006.01) | |
| *H01L 31/103* | (2006.01) | |
| *G02B 6/12* | (2006.01) | |

(52) U.S. Cl.
CPC .............. *G02B 6/243* (2013.01); *G02B 6/122* (2013.01); *G02B 6/125* (2013.01); *G02B 6/131* (2013.01); *G02B 6/132* (2013.01); *G02B 6/136* (2013.01); *G02B 6/1347* (2013.01); *G02B 2006/12126* (2013.01); *G02B 2006/12157* (2013.01); *H01L 31/028* (2013.01); *H01L 31/103* (2013.01); *Y02P 70/521* (2015.11)

(58) Field of Classification Search
None
See application file for complete search history.

(56) References Cited

U.S. PATENT DOCUMENTS

| | | |
|---|---|---|
| 3,970,360 A | 7/1976 | Kersten et al. |
| 5,325,459 A | 6/1994 | Schmidt |

(Continued)

FOREIGN PATENT DOCUMENTS

CN  102385175 A  3/2012

OTHER PUBLICATIONS

Kim, Jin Tae et al., Polymer Planar-Lightwave-Circuit-Type Variable Optical Attenuator Fabricated by Hot Embossing Process ETRI Journal Feb. 28, 2005, vol. 27, No. 1.

(Continued)

*Primary Examiner* — Chad H Smith

(57) ABSTRACT

An optical attenuator and/or optical terminator is provided. The device includes an optical channel having two regions with different optical properties, such as an undoped silicon region which is less optically absorptive and a doped silicon region which is more optically absorptive. Other materials may also be used. A facet at the interface between the two regions is oriented at a non-perpendicular angle relative to a longitudinal axis of the channel. The angle can be configured to mitigate back reflection. Multiple facets may be included between different pairs of regions. The device may further include curved and/or tapers to further facilitate attenuation and/or optical termination.

23 Claims, 6 Drawing Sheets

(56) References Cited

U.S. PATENT DOCUMENTS

| | | | |
|---|---|---|---|
| 2003/0108274 A1* | 6/2003 | Haronian | G02B 6/122 385/17 |
| 2004/0126079 A1 | 7/2004 | Aoki et al. | |
| 2005/0105877 A1* | 5/2005 | Nappi | G02B 6/262 385/140 |
| 2005/0111782 A1* | 5/2005 | Donval | G02B 6/264 385/16 |
| 2006/0044653 A1 | 3/2006 | Stolk | |
| 2006/0104593 A1* | 5/2006 | Gowda | G02B 6/262 385/140 |
| 2008/0279231 A1* | 11/2008 | Farber | G02B 6/14 372/21 |
| 2012/0057841 A1* | 3/2012 | Wysocki | G02B 6/243 385/139 |
| 2014/0105544 A1* | 4/2014 | Ushida | G02B 6/12 385/77 |
| 2015/0212271 A1* | 7/2015 | Chen | G02B 6/243 385/14 |

OTHER PUBLICATIONS

International Search Report dated Sep. 28, 2016 for International Patent Application No. PCT/CN2016/090202 filed on Jul. 15, 2016.
English Abstract for CN102385175.
Vilson R. Almeida, Roberto R. Panepucci, Michal Lipson, "Nanotaper for compact mode conversion," Optics Letters, 2003, pp. 1302-1304, vol. 28, Issue 15.
Amy C. Turner, Christina Manolatou, Bradley S. Schmidt, Michal Lipson, Mark A. Foster, Jay E. Sharping, and Alexander L. Gaeta, "Tailored anomalous group-velocity dispersion in silicon channel waveguides", Optics Express, May 15, 2006, pp. 4357-4362, vol. 14, No. 10.

* cited by examiner

US 9,946,023 B2

OPTICAL ATTENUATOR AND FABRICATION METHOD THEREOF

FIELD OF THE DISCLOSURE

The present disclosure relates to the field of photonics, and in particular to an optical attenuator for use in an integrated photonic circuit environment.

BACKGROUND

Photonic circuits are integrated devices comprising optical technologies for providing high speed data transmission in the terabit range. The circuits may include hundreds of optical components utilizing wavelengths in the nanometer scale. Photonic circuits may be employed in a number of applications, including telecommunications and data computation.

SUMMARY

An object of embodiments of the present disclosure is to provide an optical attenuator for reducing back reflections in photonic circuits.

In accordance with embodiments described in the present disclosure, there is provided an optical attenuator which includes a channel having a longitudinal axis. The channel has a first portion in contact with a second portion to define a facet therebetween, wherein the facet is at least partially oriented at a non-perpendicular angle relative to the longitudinal axis.

In accordance with embodiments described in the present disclosure, there is provided a method for fabricating an optical attenuator comprising: selectively etching a semiconductor wafer to define a channel; and implanting dopants into a second portion of the channel to define a facet between the second portion and a first portion, the facet being at least partially oriented at a non-perpendicular angle relative to a longitudinal axis of the channel.

In accordance with embodiments described in the present disclosure, there is provided an optical attenuator comprising: a first portion having a longitudinal axis; and a second portion sharing the longitudinal axis of the first portion, having optical properties different than the first portion, and in contact with the first portion at a facet oriented at a non-perpendicular angle relative to the longitudinal axis.

BRIEF DESCRIPTION OF THE FIGURES

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Photonic circuits utilize a number of optical components in order to transmit and receive optical signals across the circuit and between devices. One issue to be addressed in these circuits, is the occurrence of back reflections as the signal traverses various optical interfaces. Back reflections are an undesirable phenomenon which introduces noise into the communications channel and degrades signal quality. Back reflections may also arise from poor or imperfect termination of received signals. The challenge of controlling back reflections becomes increasingly important in larger circuits, as individual noise contributions may coherently interact to create unpredictable signal impairment. Accordingly, an optical attenuator and/or optical terminator which reduces the effect of back reflections in photonic circuits, is desirable.

Embodiments discussed in the present disclosure are directed towards an optical attenuator comprising a first portion in contact with a second portion to define facet in between that is at least partially angled. The first and second portions may have different optical properties, for example with the second portion being more optically absorbing than the first portion. This difference in optical properties contributes to the definition of the facet. The first portion may comprise an intrinsic semiconductor material, while the second portion may comprise a doped semiconductor material. Selection of the semiconductor materials, dopant concentration, facet angle, and attenuator dimensions is performed so as to provide for selective attenuation of optical waves to mitigate or eliminate back reflections.

Figure 1A:
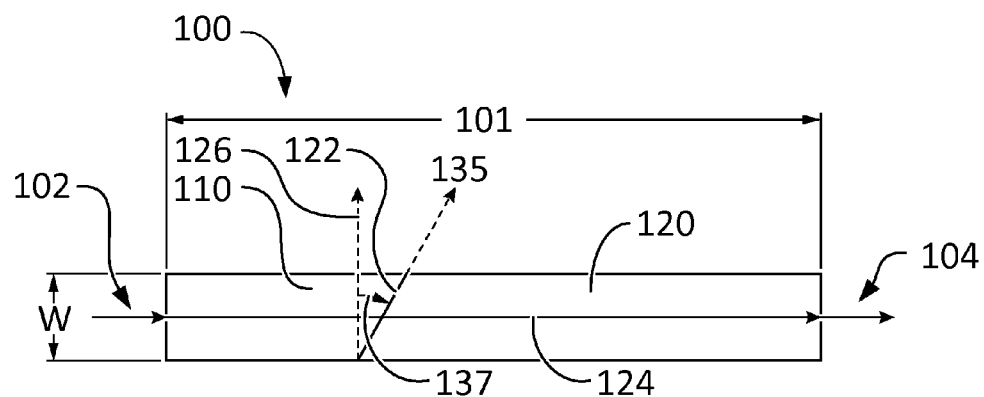
FIG. 1(a) is a plan view of an optical attenuator, according to an embodiment.
Figure 1B:
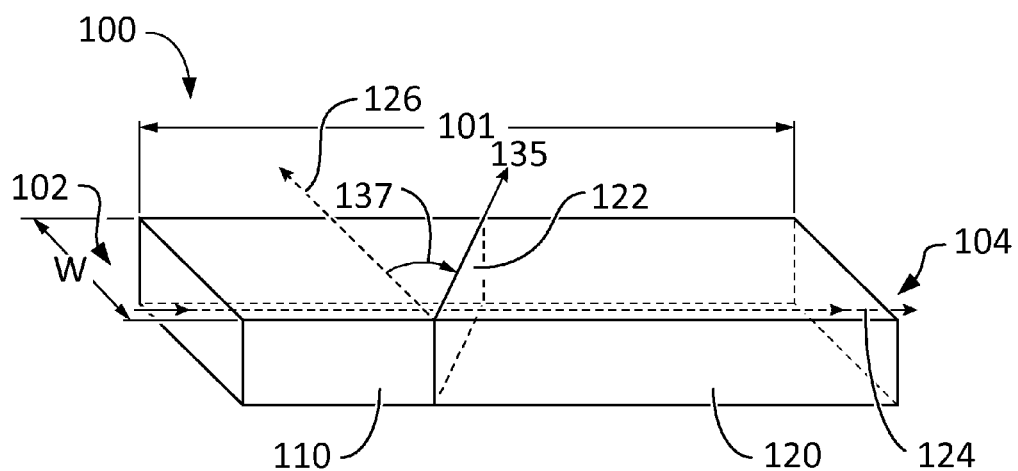
FIG. 1(b) is a transparent perspective view of the optical attenuator in FIG. 1(a).

Referring to FIGS. 1(a)-(b), there is shown an embodiment of an optical attenuator 100 according to the present disclosure. FIG. 1(a) shows the attenuator from a top view, while a perspective view is shown in FIG. 1(b). The optical attenuator 100 includes a channel 101 extending along longitudinal axis 124, and comprises a first portion 110 in contact with a second portion 120. Facet 122 is defined by the interface between the first portion 110 and the second portion 120, and is oriented and shaped according to the relative arrangement of the first and second portions 110, 120. As shown in the embodiment of FIGS. 1(a)-(b), facet 122 is substantially planar and oriented along line 135 at facet angle 137 relative to transverse axis 126 which is perpendicular to the longitudinal axis 124. Optical attenuator 100 further includes an input end 102 adjacent to the first portion 110, and an output end 104 adjacent to the second portion 120. In some embodiments, the width, w, of the channel 101 is about 500 nm.

Figure 1C:
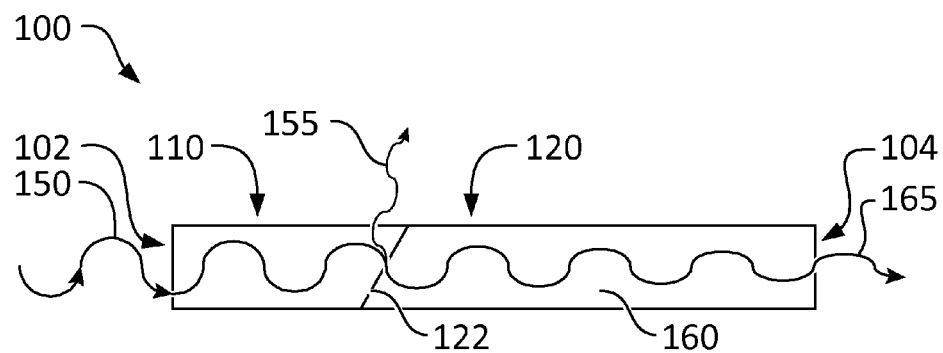
FIG. 1(c) illustrates operation of the optical attenuator in FIGS. 1(a)-(b), according to an embodiment.

Operation of optical attenuator 100 is illustrated with reference to FIG. 1(c). Optical signal 150 is introduced into the input end 102, and propagates through the first portion 110. When optical signal 150 encounters the facet 122 a partial reflection occurs. The reflected portion will diverge at an angle determined by the angle of incidence of the signal upon facet 122 (as well as by the relative differences in the optical characteristics of the first and second portions). As illustrated, a reflected portion 155 is reflected outside the channel 101 in a non-counter-propagating direction (for example, reflected outward from the side of the channel as shown in FIG. 1(c)). The transmitted portion 160 of the optical signal 150 that traverses the facet 122, is attenuated as it propagates across the second portion 120, for example due to optically absorbing properties of the second portion 120. Any part of the transmitted portion 160 not otherwise absorbed by the second portion 120 may exit the output end 104 as residual light 165. It should be understood by those skilled in the art that the transmitted portion 160 is already attenuated as it enters the second portion 120 as a result of the reflection.

The optical properties and dimensions of the first and second portions 110, 120 may be selected as to achieve a desired attenuating effect. The length of the first and second portions 110, 120 may also be configured to provide a desired amount of attenuation. The relative optical properties between the first and second portions 110, 120 may also be selected to achieve a desired optical effect at the facet 122. For example, in some embodiments, the properties of the first and second portions 110, 120 may be selected such that the optical attenuator 100 may be used as an optical terminator.

Figure 1D:
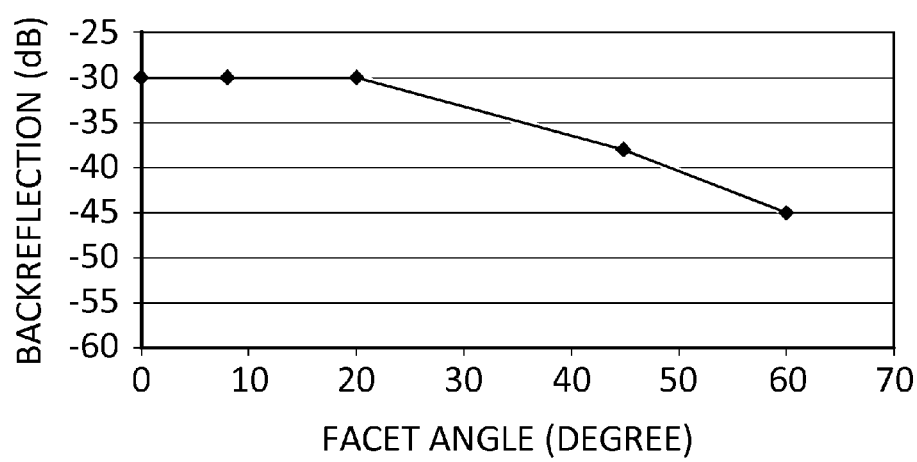
FIG. 1(d) is a graph simulating potential reduction in back reflection with the optical attenuator in FIGS. 1(a)-(b) as a function of facet angle, according to an embodiment.

As indicated above, facet 122 creates an interface which may reflect a portion 155 of the optical signal 150 outside of the channel 101, while the second portion 120 at least partially absorbs the transmitted portion 160 of the optical signal 150 that traverses the facet 122. The existence of the facet 122 and the resultant reflection can be due to the different optical properties of the materials comprising the first and second portions 110, 120. For example, the second portion 120 may comprise more optically absorbing material than that of the first portion 110. Moreover, orientation of the facet 122 (hereinafter "facet angle") may be selected according to the relative arrangement of the first and second portions 110, 120 (for example through the fabrication process) to control the reflected portion 155 and thus attenuation of the optical signal 150. The graph in FIG. 1(d) presents the results of a simulation of the potential back reflection of the optical signal 150 from the facet 122 as a function of facet angle 137, according to an embodiment wherein the first portion 110 comprises intrinsic silicon, the second portion 120 comprises doped silicon, the channel 101 comprises a 220 nm by 500 nm waveguide, and the optical signal 150 comprises a 1550 nm wavelength.

It is noted that the facet 122, which is non-perpendicularly angled relative to the longitudinal axis of the channel, may nonetheless have a defining plane which is perpendicular to opposing sidewalls of the optical channel, albeit meeting those sidewalls at an angle. This is illustrated for example in FIG. 1(b). Alternatively, embodiments of the present disclosure may include a facet, the defining plane of which is angled with respect to the opposing sidewalls of the optical channel. This is illustrated for example in FIGS. 2 and 3.

While FIGS. 1(a)-(b) illustrate the facet 122 comprising a substantially planar shape, in other embodiments (not shown) the facet may comprise a curved shape having at least a non-perpendicular portion relative to the longitudinal axis 124. For example, the facet may also comprise a curved sheet (not shown), having a perpendicular portion relative to the longitudinal axis 124, with edges meeting the sidewalls of the channel 101 at a non-perpendicular angle.

As indicated above, the materials comprising the first and second portions 110, 120 may also be selected to further control attenuation of the optical signal 150 as it propagates along the channel 101. For semiconductor photonics, dopants may be introduced into semiconductor materials to create an optical loss in optical structures. For example, the second portion 120 may comprise a doped semiconductor material which at least partially absorbs optical waves which propagate across. The type of dopant, and dopant concentration may also be varied to further control the level of optical loss. For example, dopant concentrations in the range of $10^{17}/cm^3$ to $2\times10^{18}/cm^3$ may be used. The first portion 110 may comprise an intrinsic semiconductor material for fabrication onto a semiconductor substrate and for lattice matching with the second portion 120.

In one embodiment, the first portion 110 comprises intrinsic silicon material, the second portion 120 comprises p-type Boron doped silicon, and the facet angle 137 is about 60 degrees as a result of the fabrication and annealing process for the channel 101. In another embodiment, the first and second portions 110, 120 may comprise different intrinsic semiconductor materials sufficient to establish the facet 122. For example, the first portion 110 may comprise intrinsic silicon, while the second portion 120 comprises intrinsic germanium, or a heterogeneously integrated III-V compound. In other embodiments, the composition of the first portion 110, second portion 120, and facet angle 137 may vary accordingly. The following table outlines potential semiconductor materials that may comprise portions of the channel, such as the first and second portions 110, 120, along with possible dopants that may be implanted in the first or second portions 110, 120 according to a given fabrication process.

TABLE 1

| List of potential semiconductor materials and dopants | |
|---|---|
| Materials | Dopants |
| Diamond, Silicon, Germanium, Silicon Carbide, Silicon Germanium, III-V semiconductor compounds (Gallium nitride, Gallium(III) arsenide, Indium arsenide, Indium phosphide, Zinc selenide, Zinc sulfide, Silicon carbide, Indium(III) selenide, etc..) | Boron, Arsenic, Phosphorus and Gallium |

Figure 2:
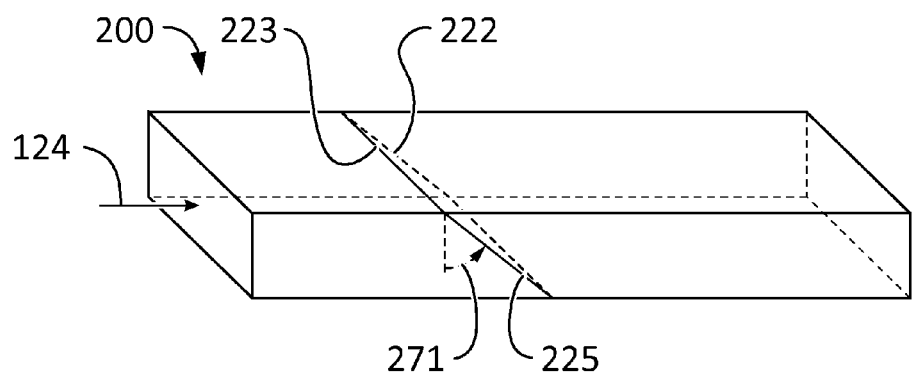
FIG. 2 is a transparent perspective view of an optical attenuator, according to another embodiment.
Figure 3:
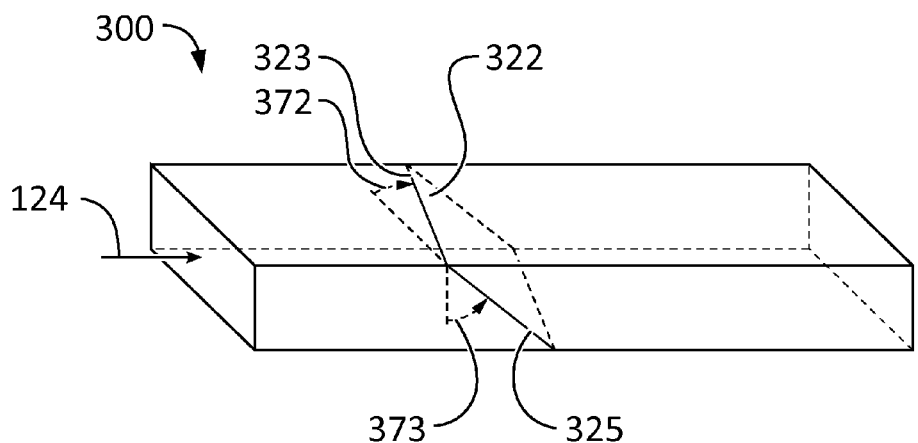
FIG. 3 is a transparent perspective view of an optical attenuator, according to yet another embodiment.

FIGS. 2 and 3 illustrate alternative embodiments of an optical attenuator, with facets having alternative orientations. For clarity of exposition, the facet is illustrated within an optical channel having a rectangular cross section. However, it will be appreciated that other shapes of optical channels may be used.

Referring to FIG. 2, there is shown another embodiment of an optical attenuator 200 analagous to the optical attenuator 100 of FIGS. 1(a)-(b). In FIG. 2, the facet 222 has one edge 223 perpendicular to the longitudinal axis 124, and another adjacent edge 225 oriented at a non-perpendicular angle 271 relative to the longitudinal axis 124.

Referring to FIG. 3, there is shown another embodiment of an optical attenuator 300 comparable to the optical attenuator 100 of FIGS. 1(a)-(b). In FIG. 3, the facet 322 has two adjacent edges 323, 325 oriented at different respective non-perpendicular angles 372, 373 relative to the longitudinal axis 124. As such, the facet intersects all four faces of the channel at non-perpendicular angles.

Figure 4A:
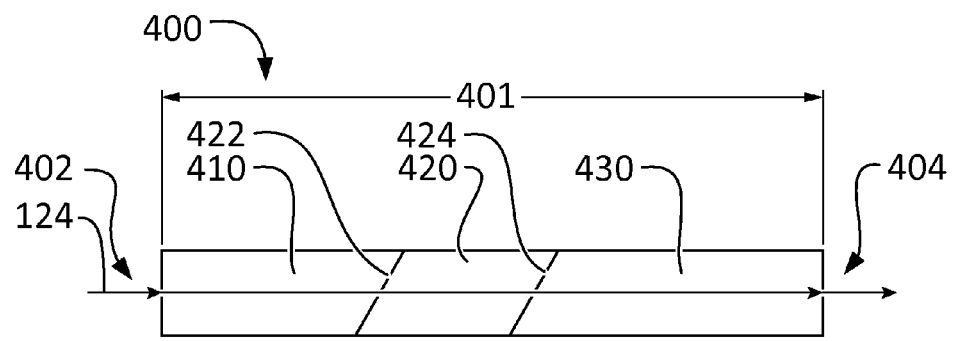
FIG. 4(a) is a plan view of an optical attenuator comprising two facets, according to yet another embodiment.
Figure 4B:
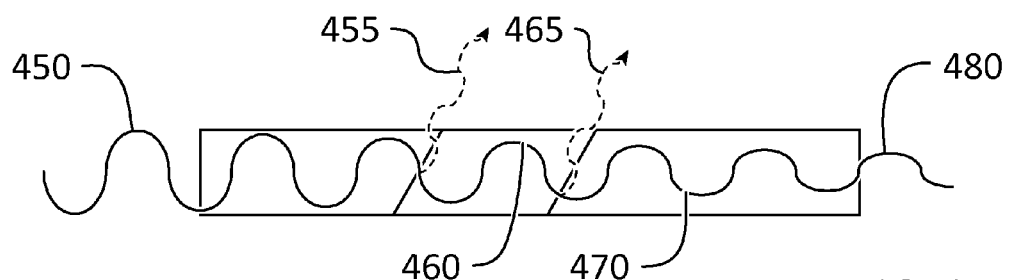
FIG. 4(b) illustrates operation of the optical attenuator in FIG. 4(a), according to an embodiment.

Referring to FIGS. 4(a)-(b), there is shown a plan view of another embodiment of an optical attenuator 400; this embodiment is similar to the attenuator 100 in FIGS. 1(a)-(b), but comprises a third portion and thus a second facet, as will be described below. The optical attenuator 400 includes a channel 401 extending along longitudinal axis 124, and comprises a first portion 410 in contact with a second portion 420, and a third portion 430 in contact with the second portion 420. First and second facets 422, 424 are defined by the interfaces between the first and second portions 410, 420, and second and third portions 420, 430, respectively. Optical attenuator 400 further includes an input end 402 adjacent first portion 410, and output end 404 adjacent third portion 430. As shown in FIG. 4(a), first and second facets 422, 424 are substantially planar, and oriented at non-perpendicular angles relative to the longitudinal axis 124. However, in other embodiments (not shown) the shape and facet angles of first and second facets 422, 424 may vary according to a given fabrication process and selected materials for the first, second and third portions 410, 420, 430. For example, the facets 422, 424 may comprise both perpendicular and non-perpendicular portions relative to the longitudinal axis 124. Also, the two facets may be parallel to each other or non-parallel in other embodiments.

Operation of attenuator 400 is described with reference to FIG. 4(b). Optical signal 450 is introduced into the input end 402, from which it propagates across the first portion 410. As the optical signal 450 encounters the first facet 422, a first reflected portion 455 of it is reflected in a non-counter-propagating direction (for example, reflected outside the channel 401 as shown in FIG. 4(b)). A first transmitted portion 460 of the optical signal 450 which is transmitted through the first facet 422, is partially attenuated by the second portion 420 as it propagates towards the second facet 424. As the first transmitted portion 460 encounters the second facet 424, a second reflection occurs. Reflected portion 465 is reflected in a non-counter-propagating direction. A second transmitted portion 470 traverses the second facet 424, and is further attenuated as it propagates through the third portion 430 towards the output 404. Any part of the second transmitted portion 470 not otherwise absorbed by the third portion 430 exits the output end 404 as residual light 480.

Similar to the embodiment shown in FIGS. 1(a)-(b), materials comprising the first, second, and third portions 410, 420, 430, and facet angles for first and second facets 422, 424, may be selected as to achieve a desired attenuating effect. For example, the first portion 410 may comprise an intrinsic semiconductor material, while second and third portions 420, 430 may comprise doped semiconductor materials, wherein the third portion 430 comprises a higher dopant concentration than the second portion 420. The amount of power reflected in reflected portions 455 and 465 is a function of the differences in the optical characteristics of the different materials.

In certain embodiments, the second portion 420 is more optically absorbing than the first portion 410, and the third portion 430 is more optically absorbing than the second portion 420. This results in more gradual change in optical properties along the channel 401, which may assist in reducing back reflection at facets 422, 424. This in turn may allow the facet angles to be closer to perpendicular relative to the longitudinal axis.

Although only two facets 422, 424 are shown in the embodiment in FIGS. 4(a) and 4(b), it should be appreciated that in other embodiments (not shown), additional facets may also be provided in a similar manner, with each facet located at the interface between intermediate portions of the channel. In certain embodiments, as the number of intermediate portions increases, the difference between optical properties of adjacent portions may be limited or minimized, and the facet may become less well-defined. For example, in one embodiment, the optical properties of the channel changes continuously along its length. For example, the dopant concentration may change in a substantially continuous manner along the optical channel length (e.g. in the direction of the axis of propagation). The start of this continuous change in the channel may be angled to create a facet such as facet 422. The differences in the indices of refraction between the first portion and the second portion, at the interface, will result in a back reflection that is angled out of the channel. If the change in the optical properties of the channel is gradual, there may be no further back reflections.

In various embodiments, the output end 404 may correspond to a termination of the optical channel at a face which is perpendicular to the longitudinal axis 124. In this case, the termination of the optical channel may cause a back reflection which passes back through the third portion 430, the second portion 420 and into the first portion 410. However, such a back reflection, applied to an already significantly attenuated signal, experiences further attenuation in traversal of the third and second portions as well as reflections caused by the traversal through the facets 422, 424 in the reverse direction. As such, the back reflection may have a signal strength which is below design tolerance levels. Furthermore, incorporation of features such as a taper, bend, tapered bend, angled termination facet, or the like, at of the optical channel output end may further mitigate the potential for back reflection. The output end 104 of FIG. 1 may be configured similarly.

Figure 4C:
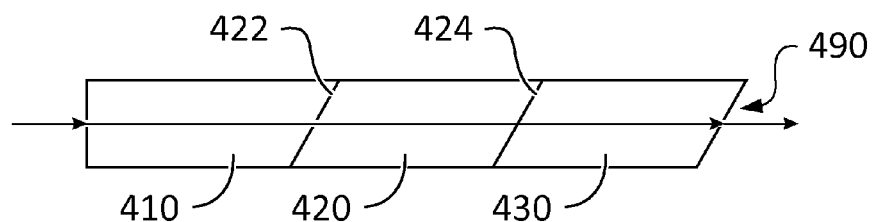
FIG. 4(c) illustrates an alternative optical attenuator, according to an embodiment.

FIG. 4(c) illustrates yet another embodiment of an optical attenuator, which is comparable to the optical attenuator of FIG. 4(a) except that an end portion 490 which is oriented at a non-perpendicular angle relative to the longitudinal axis is explicitly illustrated. The angled end portion may further serve to mitigate back reflection in some embodiments. It will be understood by those skilled in the art that the differences between the indices of refraction in the first and second portions, and the second and third portions, will likely be very small in relation to the difference between the third portion and the material after the termination. As a result, in many embodiments there will be differences in the angles of reflection. Alternatively, the optical attenuator may terminate in a tapered section, a curved section, or a tapered and curved section. Yet further, an end of the tapered or curved section may be oriented at a non-perpendicular angle relative to a longitudinal axis that generally describes the direction of the optical channel in the region immediately in the optical channel's end region.

Embodiments of the present disclosure are directed towards an optical attenuator or optical terminator having multiple attenuation portions. Each of the portions can use different attenuation techniques. Some of the attenuation portions may rely on optical absorption for example using doped silicon as described above. Other attenuation portions may include tapering of the optical attenuator, non-adiabatic bending of the optical attenuator, or a combination thereof. For example, one embodiment of the present disclosure may correspond to an optical attenuator/terminator having a curved and tapered end section configured to attenuate optical signals and optionally allow signal leakage due to the radius of curvature (roc) of the end section being lower than adiabatic curvature. The incorporation of an end section that is both tapered and curved may lead to an improvement in optical attenuation and/or back reflection properties compared to an end section that is only tapered. In one embodiment, the curvature of the end section may reduce back reflection in part due to the orientation of the sidewalls at a non-perpendicular angle relative to the longitudinal axis of the channel.

Figure 5:
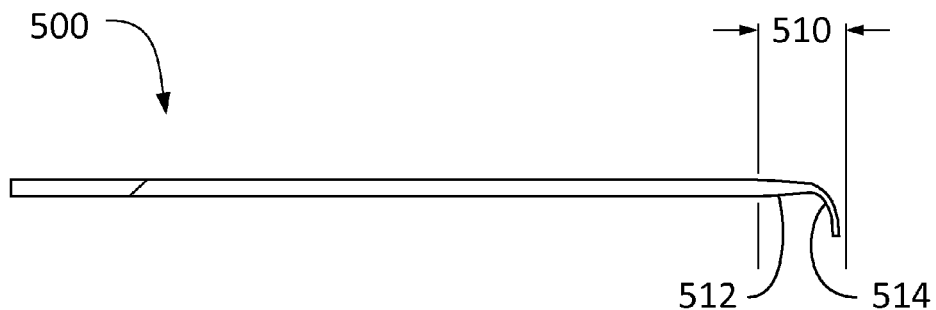
FIG. 5 is a plan view of an optical attenuator comprising a bend and taper, according to yet another embodiment.

Referring to FIG. 5, there is shown another embodiment of an optical attenuator 500. Optical attenuator 500 has a first section that can be any combination of the attenuators 100 200, 300 or 400, as illustrated in FIGS. 1(a)-(b), 2, 3, and 4(a)-(b) respectively. Following the first section is a second section 510 that has both a taper 512 and a bend 514. The taper 512 provides additional attenuation suitable for passive split wafers, while the bend 514 provides improved passive split performance. Accordingly, attenuator 500 may be suitable for use as a termination waveguide. The taper 512 may, in some embodiments, be a microtaper or a nanotaper. The taper 512 may divert light into cladding (not shown) adjacent to the optical attenuator 500. The taper 512 may correspond to a region in which the optical channel width decreases monotonically, for example linearly.

While FIG. 5 shows the bend 514 and taper 512 overlapping (i.e. the bend 514 is also tapered), in other embodiments, they may be non-overlapping. In embodiments where attenuator 500 comprises attenuator 100 of FIGS. 1(a)-(b), the second portion 120 may have a relatively higher optically absorbing property than the first portion 110, the first and second portions 110, 120 being separated by an angled facet 122. In embodiments where attenuator 500 comprises attenuator 400 of FIGS. 4(a)-(b), the third portion 430 may have a relatively higher optically absorptive property than the second portion 420, and the second portion 420 may have a relatively higher absorptive property than the first portion 410, wherein the first and section portions 410, 420 are separated by facet 422, and second and third portions 420, 430 are separated by facet 424.

In additional embodiments, the bend 514 may be a non-adiabatic bend. The bend 514 may therefore have a sufficiently tight radius of curvature that causes residual light to escape from the region of the bend 514 for absorption by cladding (not shown) adjacent to the optical attenuator 500. In one embodiment, the radius of curvature is about 2 micrometers. In another embodiment, the trailing section (i.e. second portion 120 in FIG. 1(a) or third portion 430 in FIG. 4(a)) comprises a doped portion of 85 µm length, followed by a 10 µm tapered section, for example incorporating a 2 µm radius of curvature bend at an end thereof.

Figure 6:
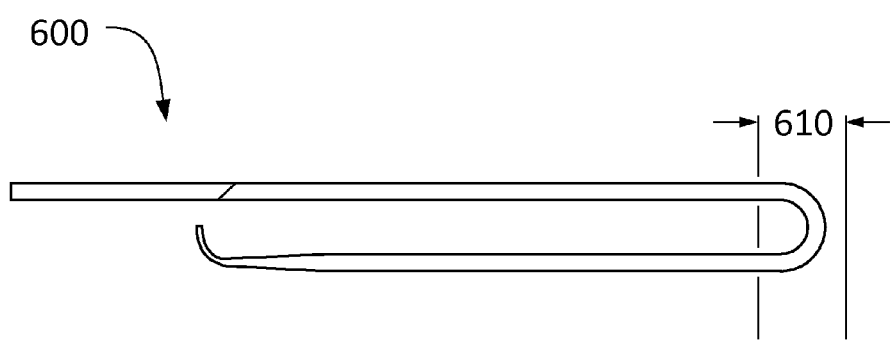
FIG. 6 is a plan view of an optical attenuator comprising a curved section, according to yet another embodiment.

Referring to FIG. 6, there is shown another embodiment of an optical attenuator 600 similar to attenuator 500 in FIG. 5, but further comprising a curved section 610 prior to the taper 612 and bend 614; the additional curved section 610 is shown as an adiabatic bend, and reduces overall length of the attenuator 600. The curved section 610, for example, may span a width of 5 µm. In other embodiments (not shown), different numbers and two-dimensional or three-dimensional orientations of curved sections, tapers, and adiabatic curves may be employed. Multiple curves may be provided in optical attenuators 100, 200, 300, 400, and 500, for example, to give a planar or non-planar serpentine shape. Such curving may facilitate fitting of the optical attenuator 100, 200, 300, 400, 500 into a limited space, for example. The following table outlines the potential attenuation of back reflection that may be achieved by attenuator 100 shown in FIGS. 1(a)-(b) in comparison to various intrinsic silicon waveguides having specific features below. The values were obtained through simulation of the optical channel using a three-dimensional finite-difference time-domain method.

TABLE 2

List of Attenuator/Terminator Configurations

| Composition | Attenuation of back reflection (dB) |
|---|---|
| Intrinsic silicon waveguide terminated with a perpendicular facet | −9 |
| Intrinsic silicon waveguide with nanotaper | −23 |
| Intrinsic silicon waveguide with nanotaper and 2 um roc bend | −35 |
| Attenuator with 60° facet, and doped second portion | −45 |

Figure 7:
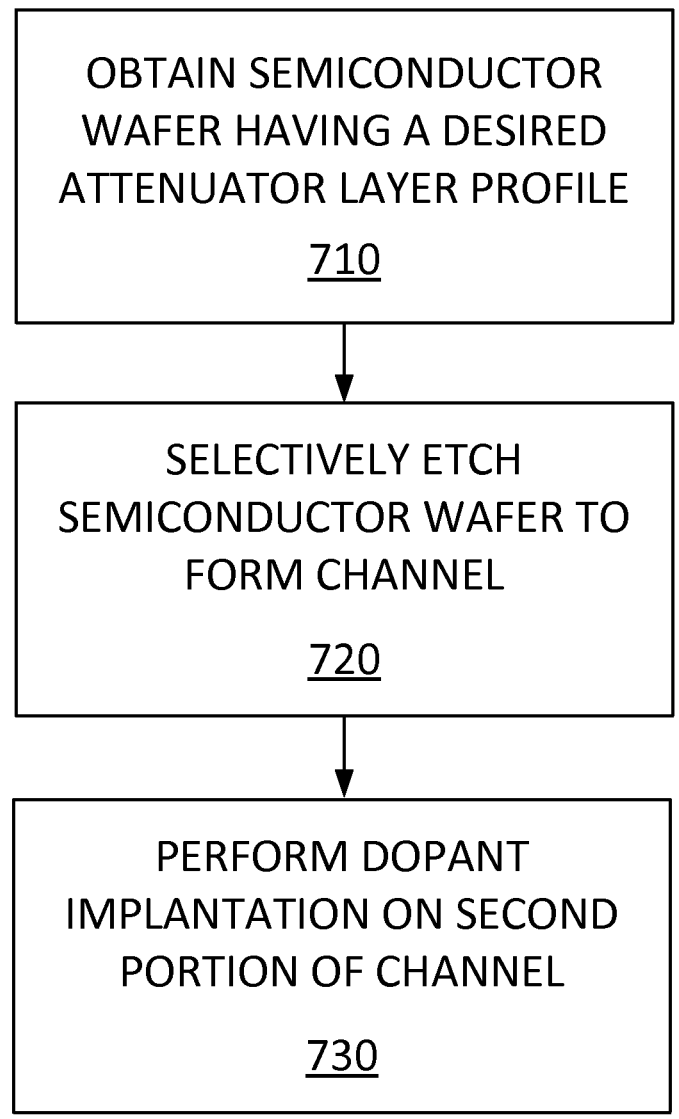
FIG. 7 is a flow chart illustrating a method for fabricating an optical attenuator, according to an embodiment.

Referring to FIG. 7, there is shown a method 700 for fabricating an optical attenuator, such as the optical attenuator 100 shown in FIGS. 1(a)-(b), wherein the first and second portions 110, 120 comprise semiconductor materials, and the second portion 120 further comprises implanted dopants.

At step 710, a semiconductor wafer is obtained having a desired attenuator layer profile. For example, semiconductor wafer may be a commercial SOI wafer comprising a silicon substrate, followed by layer of silicon oxide (or "buried oxide"), and a thin layer of silicon (220 nm, for example) on top. The silicon oxide layer may be two microns in thickness, which is thicker than that typically used for electronics.

At step 720, the semiconductor wafer is selectively etched to form the channel 101. A suitable pattern may be determined to form the desired channel configuration/dimension Photoresist may then be accordingly applied, exposed to UV light, and then washed to expose selected portions for etching. The top layer of the wafer (silicon, for example) may then be fully etched, partially etched, or etched by combination of full/partial etch steps to define the channel 101 on the semiconductor substrate. The pattern of each etch step is determined by a given photolithographic process.

At step 730, dopant implantation is performed on the second portion 120 of the channel 101. A suitable masking pattern is determined to cover the first portion 110 and expose the second portion 120 for doping. Dopant implantation may comprise multiple steps, wherein the profile and pattern of the implantation is determined by a masking process. The facet separating the first and second portions therefore corresponds to the doping profile of the semiconductor, and may be at least partially oriented at a non-perpendicular angle relative to the longitudinal axis.

In additional embodiments (not shown), the method 700 may include further steps. For example, after dopant implantation, selective growth of germanium on top of the channel can be made to make photodiodes. Germanium may also be grown following a masking process and implanted with dopants to create electrical contacts. Also, oxide layer deposition steps may follow to provide an upper cladding of oxide, and metal contacts to the attenuator. These may include at least one of the steps of etching, chemical-mechanical planarization (CMP), and metal deposition.

In some embodiments, such as the optical attenuator 200, 300 in FIGS. 2-3 for example, the method 700 may further include orienting the channel (or semiconductor wafer) prior to dopant implantation, such that facets 222, 322, may have a corresponding configuration. For example, when dopant implantation is performed via vertical bombardment, the channel may be appropriately masked to cover the first portion and expose the second portion, and the channel may be inserted into the implantation apparatus in a three-dimensional orientation corresponding to the desired facet orientation. That is, the channel is placed so that the facet is substantially parallel to the direction of dopant bombardment. In some embodiments, rather than placing the channel in a non-orthogonal position within the implantation apparatus chamber so as to enable provision of a facet such as in FIGS. 2 and 3, the placement of the dopant source, and hence the direction of bombardment, may be adjusted.

In some embodiments, such as the optical attenuator 400 in FIG. 4(*a*) for example, the method 700 may further include an additional masking and dopant implantation step in order to provide a higher dopant concentration for the third portion 430. For example, an additional masking step may be carried out as to cover the first and second portions 410, 420, and expose the third portion 430. The third portion 430 may then be exposed to additional dopant implantation in order to result in a higher dopant concentration compared to the first and second portions 410, 420.

In certain embodiments, the optical attenuator 100, 200, 300, 400, 500 may be co-fabricated with other portions of an optical circuit. The optical circuit, including the optical attenuator, may be formed on a common wafer, and batches of numerous such optical circuits may be manufactured together on corresponding batches of wafers. Samples of the optical circuit, taken from the batch, may be tested prior to doping procedures applied to the batch. The pre-doped wafer may be referred to as a passive split structure. The passive split structure may refer to a partially fabricated wafer, containing only passive optical components obtained from etching the silicon layer, such as waveguides, couplers and crossings.

To facilitate testing of the passive split structure, the optical attenuator may comprise tapers and non-adiabatic bends. These features may provide optical termination capability in the absence of dopants, so that the optical components of the passive split structure may be suitably tested. While a relatively lower level attenuation may be exhibited by such an optical attenuator prior to doping, the undoped attenuator may be sufficiently functional to inhibit parasitic signals from interfering with measurements obtained for purposes of testing the passive split structure.

For example, the optical attenuator may comprise the taper 512 and/or non-adiabatic bend 514 in FIG. 5, and may thus acts to at least partially attenuate or terminate optical signals before portions of the optical channel are doped. Upon doping the second portion 120, 420 of attenuator 100, 400 for example, further testing may be performed to confirm adequate performance of the optical circuit and/or the optical attenuator. Embodiments of the present disclosure may therefore relate to an optical attenuator or optical terminator which provides a first amount of attenuation when in an undoped configuration and which provides a second, higher amount of attenuation when in a doped configuration.

Embodiments of the present disclosure may be used for terminating inputs or outputs of optical components. For example, an optical terminator as described herein may be coupled to an input or output of a 2×2 optical switching cells to transform same into a 1×2 or 2×1 switching cell.

Although the present disclosure has been highlighted with reference to specific features and embodiments thereof, it is evident that various modifications and combinations can be made thereto without departing from the scope of the disclosure as defined by the appended claims. Accordingly, the scope of the claims should not be limited by the specific embodiments set forth in the examples, but should be given the broadest interpretation consistent with the description as a whole.

What is claimed is:

1. An optical attenuator comprising:
    a channel having a longitudinal axis, the channel comprising a first portion in contact with a second portion to define a facet therebetween, the first portion being an elongate optical waveguide having an axial length and a width, the axial length being greater than the width, the first portion comprising a first doped semiconductor material, the second portion and the first portion both aligned along the longitudinal axis in a vicinity of the facet, the second portion being more optically absorbing per unit length than the first portion and comprising another doped semiconductor material, wherein the facet extends across the channel and the longitudinal axis thereof and is at least partially oriented at a non-perpendicular angle relative to the longitudinal axis, and wherein the first portion and the second portion have equal cross-sectional areas in the vicinity of the facet,
    wherein the first doped semiconductor material has a lower dopant concentration than the second portion.

2. The optical attenuator of claim 1, wherein the facet is at least partially oriented at between 20 and 60 degrees relative to the longitudinal axis.

3. The optical attenuator of claim 1, wherein the channel further comprises a tapered section located away from the facet.

4. The optical attenuator of claim 1, wherein the second portion comprises a curved section located away from the facet and forming a bend in the second portion.

5. The optical attenuator of claim 4, wherein the curved section forms an adiabatic bend.

6. The optical attenuator of claim 4, wherein the curved section is tapered.

7. The optical attenuator of claim 4, wherein the curved section has a radius of curvature configured to divert light out of the channel through sidewalls of said curved section.

8. An optical attenuator comprising:
    a channel having a longitudinal axis, the channel comprising a first portion in contact with a second portion to define a facet therebetween, the first portion comprising a semiconductor material, the second portion and the first portion both aligned along the longitudinal axis in a vicinity of the facet, wherein the facet extends across the channel and the longitudinal axis thereof and is at least partially oriented at a non-perpendicular angle relative to the longitudinal axis, and wherein the first portion and the second portion have equal cross-sectional areas in the vicinity of the facet,
    wherein the channel further comprises a third portion in contact with the second portion to define a second facet therebetween, wherein the second facet is at least partially oriented at a second non-perpendicular angle to the longitudinal axis, and
    wherein the second and third portions comprise uniformly doped semiconductor materials, the third portion having a higher dopant concentration than the second portion.

9. An optical attenuator comprising:
    a channel having a longitudinal axis, the channel comprising a first portion in contact with a second portion to define a facet therebetween, the first portion being an elongate optical waveguide having an axial length and a width, the axial length being greater than the width, the first portion comprising a semiconductor material, the second portion and the first portion both aligned along the longitudinal axis in a vicinity of the facet, the second portion being more optically absorbing per unit length than the first portion and wherein the second portion comprises another semiconductor material, wherein the facet extends across the channel and the longitudinal axis thereof and is at least partially oriented at a non-perpendicular angle relative to the longitudinal axis, and wherein the first portion and the second portion have equal cross-sectional areas in the vicinity of the facet.

10. The optical attenuator of claim 9, wherein the facet comprises a plane oriented at a non-perpendicular angle relative to the longitudinal axis.

11. The optical attenuator of claim 9, wherein said another semiconductor material of the second portion is a doped semiconductor material.

12. The optical attenuator of claim 11, wherein the doped semiconductor material comprises a dopant selected from the group consisting of boron, arsenic, phosphorus and gallium.

13. The optical attenuator of claim 11, wherein the doped semiconductor material comprises a dopant concentration between $10^{17}$ and $2\times10^{18}$ particles per cubic centimeter, and wherein the dopant concentration varies continuously along the channel in the direction of the longitudinal axis.

14. The optical attenuator of claim 9, wherein one or both of the semiconductor material and said another semiconductor material is selected from the group consisting of diamond, silicon, germanium, silicon carbide, and silicon germanium.

15. The optical attenuator of claim 9, wherein the channel further comprises a third portion in contact with the second portion to define a second facet therebetween, wherein the second facet is at least partially oriented at a second non-perpendicular angle to the longitudinal axis.

16. The optical attenuator of claim 9, wherein the channel further comprises a tapered section located away from the facet.

17. The optical attenuator of claim 9, wherein the first portion and the second portion each terminate at the facet.

18. The optical attenuator of claim 9, wherein the channel is disposed overtop of a planar surface, and wherein the facet is non-perpendicular to the planar surface.

19. The optical attenuator of claim 9, wherein the second portion comprises a curved section located away from the facet and forming a bend in the second portion.

20. The optical attenuator of claim 19, wherein the curved section forms an adiabatic bend.

21. The optical attenuator of claim 19, wherein the curved section is tapered.

22. The optical attenuator of claim 19, wherein the curved section has a radius of curvature configured to divert light out of the channel through sidewalls of said curved section.

23. The optical attenuator of claim 9, wherein the facet is at least partially oriented at between 20 and 60 degrees relative to the longitudinal axis.

\* \* \* \* \*